(12) United States Patent
Whinnery et al.

(10) Patent No.: US 8,446,077 B2
(45) Date of Patent: May 21, 2013

(54) 3-D WOVEN ACTIVE FIBER COMPOSITE

(75) Inventors: Joseph P. W. Whinnery, Marysville, OH (US); Dennis B. Chung, Dublin, OH (US)

(73) Assignee: Honda Motor Co., Ltd., Tokyo (JP)

(*) Notice: Subject to any disclaimer, the term of this patent is extended or adjusted under 35 U.S.C. 154(b) by 325 days.

(21) Appl. No.: 12/969,730

(22) Filed: Dec. 16, 2010

(65) Prior Publication Data

US 2012/0153780 A1 Jun. 21, 2012

(51) Int. Cl.
 *H01L 41/047* (2006.01)
(52) U.S. Cl.
 USPC ............................. 310/367; 310/366; 310/800
(58) Field of Classification Search
 USPC ........................................ 310/365–367, 800
 See application file for complete search history.

(56) References Cited

U.S. PATENT DOCUMENTS

| | | | |
|---|---|---|---|
| 3,904,464 A | 9/1975 | King | |
| 3,955,602 A | 5/1976 | King | |
| 4,001,478 A | 1/1977 | King | |
| 4,370,390 A | 1/1983 | Burk | |
| 5,085,252 A | 2/1992 | Mohamed et al. | |
| 5,173,358 A | 12/1992 | Anahara et al. | |
| 5,228,481 A | 7/1993 | Kimbara et al. | |
| 5,236,020 A | 8/1993 | Sakatani et al. | |
| 5,242,768 A | 9/1993 | Nagatsuka et al. | |
| 5,270,094 A | 12/1993 | Anahara et al. | |
| 5,465,760 A | 11/1995 | Mohamed et al. | |
| 5,711,960 A | 1/1998 | Shikinami | |
| 5,869,189 A | 2/1999 | Hagood et al. | |
| 5,924,459 A | 7/1999 | Evans | |
| 6,003,563 A | 12/1999 | Uchida et al. | |
| 6,051,913 A | 4/2000 | King | |
| 6,129,122 A | 10/2000 | Bilisik | |
| 6,186,185 B1 | 2/2001 | Khokar | |
| 6,315,007 B1 | 11/2001 | Mohamed et al. | |
| 6,338,367 B1 | 1/2002 | Khokar | |
| 6,345,598 B1 | 2/2002 | Bogdanovich et al. | |
| 6,431,222 B1 | 8/2002 | Khokar | |

(Continued)

FOREIGN PATENT DOCUMENTS

| JP | 62-45760 | 2/1987 |
|---|---|---|
| JP | 62045760 | 2/1987 |

(Continued)

OTHER PUBLICATIONS

Ping Tan & Liyong Tong, "Micro-electromechanics models for piezoelectric-fiber-reinforced composite materials," 61 Composites Science and Technology 759-769 (2001).

*Primary Examiner* — Derek Rosenau
(74) *Attorney, Agent, or Firm* — Plumsea Law Group, LLC

(57) ABSTRACT

A three-dimensional woven active fiber composite is disclosed. The composite includes a plurality of actuating fibers configured in a three-dimensional arrangement. The composite further includes a plurality of conductive wire electrodes that are woven through the plurality of actuating fibers. The electrodes may be configured into two dimensional electrode mats that are spaced apart along the length of the composite. Filler fibers may be used between adjacent electrode mats to help reinforce the composite. A sleeve member can also be used to help provide compressive containment for the actuating fibers and conductive wire electrodes.

30 Claims, 11 Drawing Sheets

U.S. PATENT DOCUMENTS

| | | | |
|---|---|---|---|
| 6,447,886 B1 | 9/2002 | Mohamed et al. | |
| 6,521,148 B2 | 2/2003 | Qiu et al. | |
| 6,555,488 B1 | 4/2003 | Qiu et al. | |
| 6,629,341 B2 | 10/2003 | Wilkie et al. | |
| 2003/0217780 A1 | 11/2003 | Uchida | |
| 2005/0146076 A1 | 7/2005 | Alexander et al. | |
| 2006/0057920 A1 | 3/2006 | Wigent | |
| 2006/0102455 A1 | 5/2006 | Chiang et al. | |
| 2008/0170982 A1 | 7/2008 | Zhang et al. | |
| 2008/0226870 A1 | 9/2008 | Sypeck et al. | |
| 2009/0025544 A1 | 1/2009 | Mohamed | |
| 2009/0149098 A1 | 6/2009 | Andronis et al. | |
| 2010/0063557 A1* | 3/2010 | Imran | 607/4 |
| 2010/0227521 A1* | 9/2010 | Whinnery | 442/189 |

FOREIGN PATENT DOCUMENTS

| | | |
|---|---|---|
| JP | 63-66358 | 3/1988 |
| JP | 63066358 | 3/1988 |
| JP | 4011043 | 1/1992 |
| JP | 4011044 | 1/1992 |
| JP | 5148735 | 6/1993 |
| JP | 6257032 | 9/1994 |
| JP | 6264326 | 9/1994 |
| JP | 8198679 | 8/1996 |
| JP | 2007301838 | 11/2007 |
| WO | WO2005/044483 | 5/2005 |

* cited by examiner

3-D WOVEN ACTIVE FIBER COMPOSITE

BACKGROUND

The embodiments relate to piezoelectric materials and in particular to active fiber composites comprising piezoelectric materials.

Piezoelectric materials can be arranged as fibers and combined with electrodes to yield active fiber composites. Hagood, IV et al. (U.S. Pat. No. 5,869,189) teaches composites for actuating or sensing deformation. The piezoelectric fibers are arranged in a parallel array with adjacent fibers separated by a soft polymer. Hagood further teaches flexible conductive material extending along the axial extensions of the fibers for imposing or detecting an electrical field.

Wilkie (U.S. Pat. No. 6,629,341) is directed to a method of fabricating a piezoelectric composite apparatus. Wilkie teaches a piezoelectric macro-fiber composite comprising a PZT-5 piezoelectric ceramic material formed into a wafer.

Chiang et al. (U.S. patent application publication number 2006/0102455) teaches an electrochemical actuator. The electrochemical actuator includes a support system including both top and bottom fibers. The top and bottom fibers are inert and are used to support the electrochemical actuators.

SUMMARY

Embodiments of a three dimensional woven active fiber composite are disclosed. In some embodiments, the woven active fiber composite may include various directions such as a longitudinal direction extending along a length of the woven active fiber composite, a lateral direction extending along a width of the woven active fiber composite and a vertical direction extending along a height of the woven active fiber composite. In some embodiments, the woven active fiber composite can also include a plurality of actuating fibers with each actuating fiber extending in the longitudinal direction. The woven active fiber composite may also include a first group of actuating fibers from the plurality of actuating fibers that are spaced apart from one another in the lateral direction as well as a second group of actuating fibers from the plurality of actuating fibers that are spaced apart from one another in the lateral direction. In some cases, the second group of actuating fibers may be spaced apart from the first group of actuating fibers in the vertical direction. The woven active fiber composite can also include a conductive wire electrode configured to transfer electrical energy to and from the first group of actuating fibers and the second group of actuating fibers. Moreover, in some cases, the conductive wire electrode is in contact with at least one actuating fiber from the first group of actuating fibers and the conductive wire electrode is in contact with at least one actuating fiber from the second group of actuating fibers.

In some embodiments, the woven active fiber composite can include various directions such as a longitudinal direction extending along a length of the woven active fiber composite, a lateral direction extending along a width of the woven active fiber composite and a vertical direction extending along a height of the woven active fiber composite. In some embodiments, the woven active fiber composite can also include a plurality of actuating fibers with each actuating fiber extending in the longitudinal direction. In some cases, the plurality of actuating fibers may be spaced apart in the lateral direction and the vertical direction. In some embodiments, the woven active fiber composite can include a plurality of conductive wire electrodes configured to transfer electrical energy to and from the plurality of actuating fibers. Moreover, in some cases, a first set of conductive wire electrodes are woven in a planar configuration between the plurality of actuating fibers such that the planar configuration of conductive wire electrodes extends in the lateral direction and the vertical direction.

In some embodiments, the woven active fiber composite includes various directions such as a longitudinal direction extending along a length of the woven active fiber composite and a radial direction that is perpendicular to the longitudinal direction. The radial direction may extend from an axial center line of the woven active fiber composite. The woven active fiber composite can also include a plurality of actuating fibers such that each actuating fiber extends in the longitudinal direction and such that the plurality of actuating fibers are spaced apart in the lateral direction and the vertical direction. The woven active fiber composite can also include a plurality of conductive wire electrodes configured to transfer electrical energy to and from the plurality of actuating fibers such that the plurality of conductive wire electrodes are interwoven with the plurality of actuating fibers. In some cases, the woven active fiber composite can include a sleeve member extending in the longitudinal direction, where the sleeve member is configured to wrap around an outer periphery of the woven active fiber composite in order to provide containment of the woven active fiber composite in the radial direction.

In one aspect, a woven active fiber composite includes a longitudinal direction extending along a length of the woven active fiber composite, a lateral direction extending along a width of the woven active fiber composite, and a vertical direction extending along a height of the woven active fiber composite. The woven active fiber composite also includes a plurality of actuating fibers, each actuating fiber extending in the longitudinal direction, where the plurality of actuating fibers are spaced apart from one another in the lateral direction and the vertical direction. The fiber composite also includes a first set of conductive wire electrodes woven between the plurality of actuating fibers and a second set of conductive wire electrodes woven between the plurality of actuating fibers, where the first set of conductive wire electrodes is spaced apart from the second set of conductive wire electrodes in the longitudinal direction. The fiber composite also includes a plurality of filler fibers woven between the actuating fibers, where the plurality of filler fibers are disposed between the first set of conductive wire electrodes and the second set of conductive wire electrodes.

Other systems, methods, features and advantages of the invention will be, or will become, apparent to one of ordinary skill in the art upon examination of the following figures and detailed description. It is intended that all such additional systems, methods, features and advantages be included within this description and this summary, be within the scope of the invention, and be protected by the following claims.

BRIEF DESCRIPTION OF THE DRAWINGS

Embodiments of the invention can be better understood with reference to the following drawings and description. The components in the figures are not necessarily to scale, emphasis instead being placed upon illustrating the principles of embodiments of the invention. Moreover, in the figures, like reference numerals designate corresponding parts throughout the different views.

DETAILED DESCRIPTION

Figure 1:
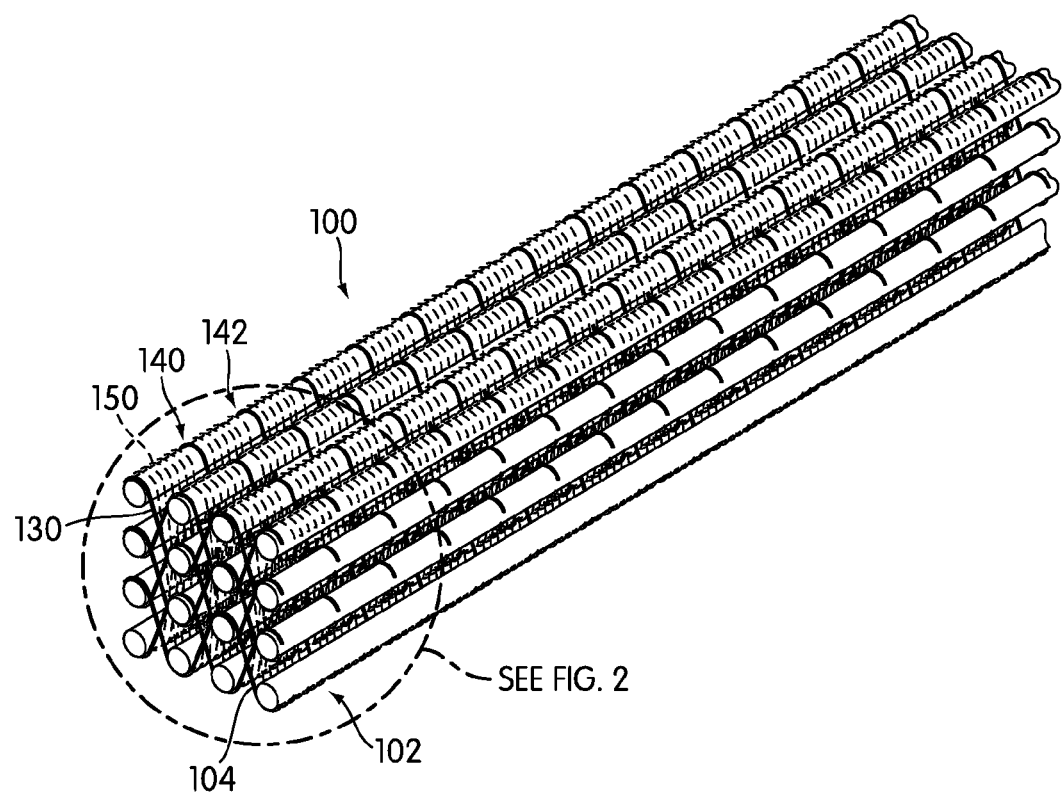
FIG. 1 is an isometric view of an embodiment of a three-dimensional woven active fiber composite.
Figure 2:
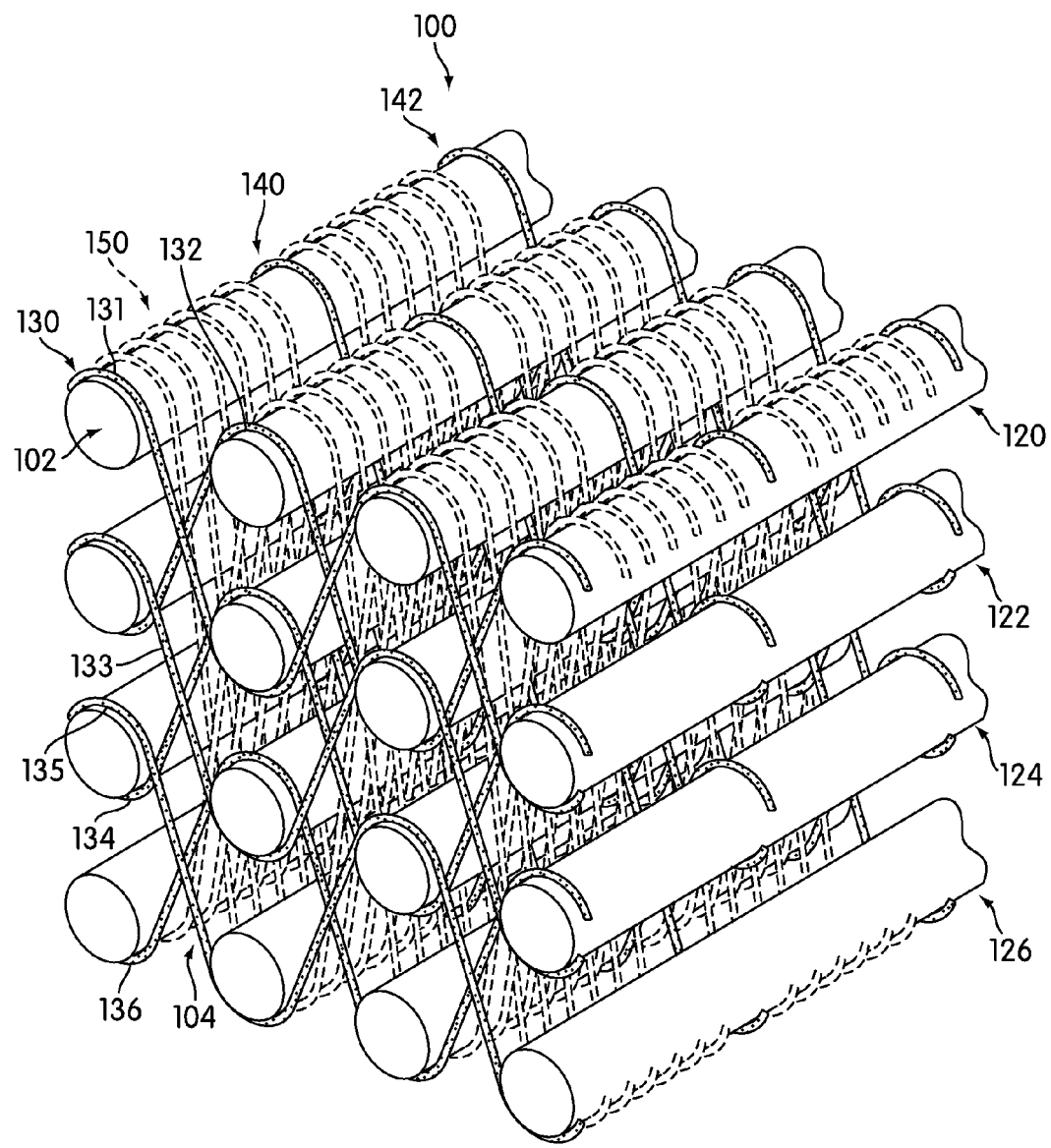
FIG. 2 is an enlarged view of an embodiment of a portion of a three-dimensional woven active fiber composite.
Figure 3:
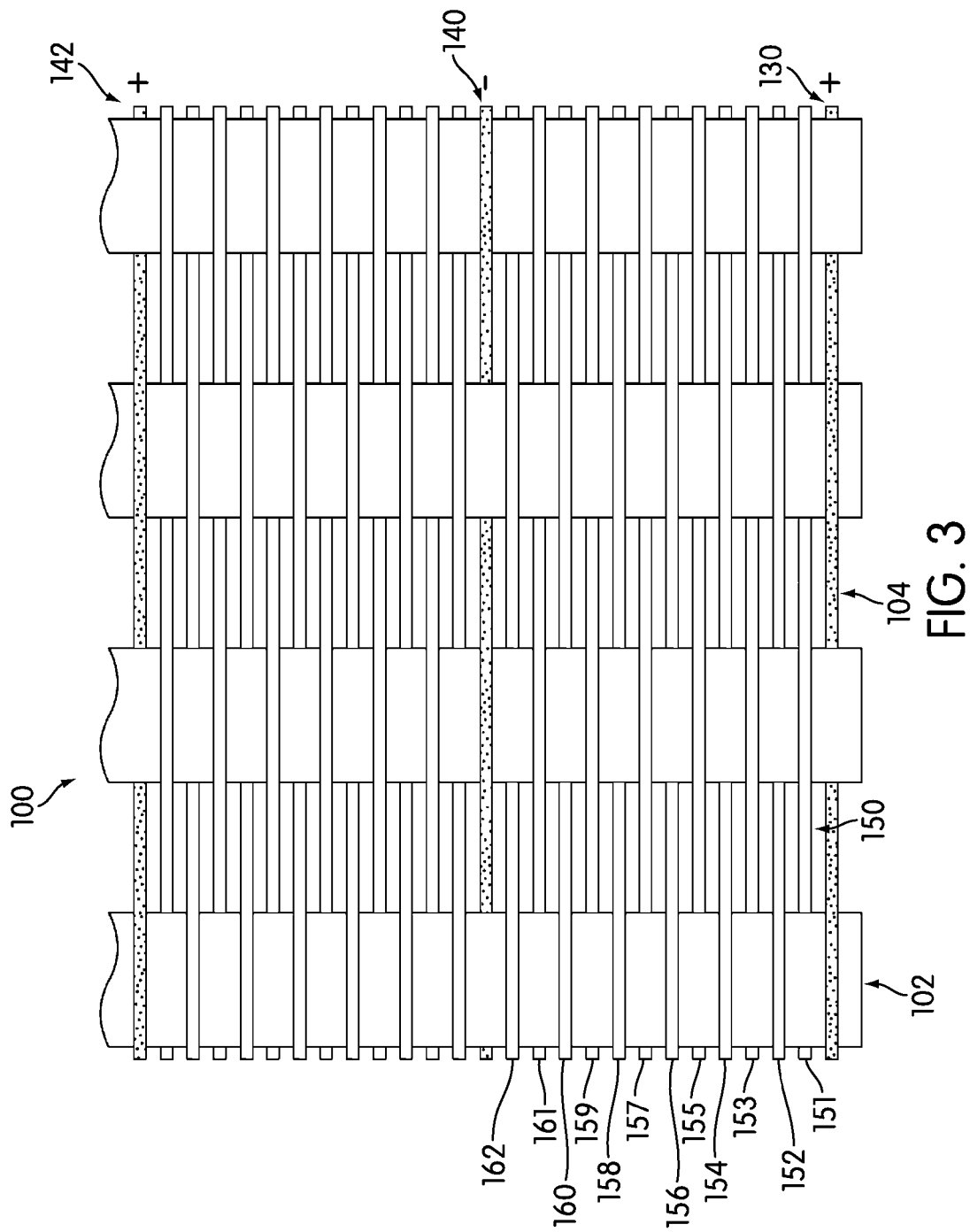
FIG. 3 is a top-down view of an embodiment of a portion of a three-dimensional woven active fiber composite.

FIGS. 1 and 2 illustrate an isometric view of an exemplary embodiment of a three-dimensional woven active fiber composite 100, hereby also referred to as composite 100. FIG. 3 illustrates a top-down view of an embodiment of composite 100. The term "active fiber composite" as used throughout the specification and claims refers to a composite material formed by combining actuating fibers with one or more sets of electrodes. The term "active fiber composite" is not intended to be limited to particular actuating materials. Furthermore, the term "active fiber composite" is not intended to be limited to particular uses. Active fiber composites as discussed throughout this detailed description may be used in various applications, including, but not limited to: energy harvesting applications, structural control applications, as well as other types of applications. In one example, one-time use lithium batteries could be replaced with energy harvesting active fiber composite materials to supply power in various electrically powered devices. In another example, active fiber composites could be used in structural control applications. Examples of structural control applications include, but are not limited to: dynamic twist control applications, structural acoustic control applications, radiated noise reduction applications, as well as other applications.

A woven active fiber composite can include fibers formed of one or more piezoelectric materials. Examples of various piezoelectric materials include, but are not limited to: natural and man-made piezoelectric crystals such as Berlinite, cane sugar, Quartz, Rochelle salt, Topaz, Tourmaline Group Minerals, Gallium orthophosphate, and Langasite. Additionally, other piezoelectric materials include man-made ceramics such as Barium titanate, Lead titanate, Lead Zirconate titanate, Potassium niobate, Lithium niobate, Lithium tantalite, Sodium tungstate, as well as polymers such as polyvinylidene fluoride (PVDF). It should be understood that this list is not meant to be exclusive and other types of piezoelectric materials could also be used to make actuating fibers for an active fiber composite.

Referring to FIGS. 1 through 3, composite 100 includes a plurality of actuating fibers 102. In this exemplary embodiment, actuating fibers 102 are fibers made of lead zirconate titanate, hereby referred to as PZT. In other embodiments, actuating fibers 102 could be made of other piezoelectric materials, as previously discussed. Actuating fibers made of PZT are known and are currently produced by the VSSP process by Advanced Cerametrics, Inc. In other cases, actuating fibers 102 may be made of piezoelectric materials that are spun into a yarn to provide a continuous desired length. For example, actuating fibers 102 may be made of many short PZT filaments that are spun into a yarn to provide a continuous desired length for actuating fibers 102.

Generally, a woven active fiber composite can comprise any number of actuating fibers. For purposes of clarity, the current embodiment includes a relatively small number of actuating fibers. In particular, the current embodiment includes approximately 16 actuating fibers. In other embodiments, however, a woven active fiber composite can include a much larger number of actuating fibers. In other embodiments, a woven active fiber composite can include N actuating fibers, where N is any number equal to or greater than 1.

Woven active fiber composite 100 can be associated with one or more directions. The term "longitudinal direction" as used throughout this detailed description and in the claims refers to a direction that is substantially parallel with a length of woven active fiber composite 100. Likewise, the term "lateral direction" as used throughout this detailed description and in the claims refers to a direction that is generally parallel with a width of woven active fiber composite 100. In other words, the lateral direction is generally perpendicular to the longitudinal direction. In addition, the term "vertical direction" as used throughout this detailed description and in the claims refers to a direction that is perpendicular to both the longitudinal and lateral directions. It should be understood that woven active fiber composite 100 may be configured to bend, twist or otherwise deform in some embodiments. In such cases, the designations of a longitudinal direction, lateral direction, and vertical direction should be understood to mean generally in a direction along the length, width and height, respectively, of composite 100. Furthermore, the terms may be used locally to describe a direction generally parallel with a length of a particular actuating fiber or a direction generally parallel with a width of a particular actuating fiber or a direction generally parallel with a height of a particular actuating fiber.

Actuating fibers of a woven active fiber composite are configured to undergo various types of actuation. In some embodiments, actuating fibers may be configured to undergo d31 actuation, which is actuation in a lateral direction of a woven active fiber composite. In other embodiments, actuating fibers may be configured to undergo d33 actuation, which is actuation in the axial direction. The term "axial direction" as used throughout this detailed description and in the claims refers to a direction that is oriented along the length of an actuating fiber. In many cases, the axial direction may be substantially parallel to a longitudinal direction of a woven active fiber composite. As actuating fibers undergo actuation in the axial direction, actuating fibers may expand or contract in the axial direction, depending on the polarity of the voltage applied to the actuating fibers. As a plurality of actuating fibers undergo actuation, this arrangement results in lengthwise expansion or contraction of the entire woven active fiber composite in a generally longitudinal direction.

Generally, actuating fibers in a three-dimensional woven active fiber composite can be configured in any three-dimensional arrangement. In some cases, actuating fibers can be arranged in a grid-like manner, with adjacent actuating fibers spaced apart from one another in the lateral direction and the vertical direction. In particular, in some cases, actuating fibers may be approximately evenly spaced apart from one another in both the lateral and vertical direction. In other cases, however, the spacing between adjacent actuating fibers can be irregular. Moreover, in other embodiments, actuating fibers may not be organized into regular rows or columns in the lateral and vertical directions.

Actuating fibers 102 may include first group of actuating fibers 120, second group of actuating fibers 122, third group of actuating fibers 124 and fourth group of actuating fibers 126. In one embodiment, each group of actuating fibers comprises four actuating fibers that are spaced apart from one another in the lateral direction. In some cases, the actuating fibers within a group may have approximately the same vertical position with respect to composite 100. In addition, each group is spaced apart from adjacent groups in the vertical direction. In other words, actuating fibers within a group are spaced apart vertically from actuating fibers in an adjacent group. For example, in one embodiment, first group of actuating fibers 120 comprise a top row of actuating fibers for composite 100. Second group of actuating fibers 122 comprises a second row that is disposed below first group of actuating fibers 120. Each actuating fiber within first group of actuating fibers 120 is vertically spaced apart from the actuating fibers within second group of actuating fibers 122. In a similar manner, third group of actuating fibers 124 comprises a third row that is disposed below second group of actuating fibers 122. Likewise, fourth group of actuating fibers 126 comprises a fourth row that is disposed below third group of actuating fibers 124.

Actuating fibers 102 have been divided into groups comprising planar-like configurations of actuating fibers that are stacked in the vertical direction for purposes of describing the arrangement of actuating fibers 102. It will be understood that this configuration of actuating fibers could also be described as comprising planar-like configurations of actuating fibers that are spaced apart in the lateral direction. Furthermore, it should be understood that in other embodiments, it may not be possible to organize actuating fibers into distinct planar-like configurations that are spaced in the vertical, lateral and/or diagonal directions. In other embodiments, for example, actuating fibers could be arranged in irregular configurations. In these situations, however, it may still be possible to find groups of actuating fibers that are spaced apart from one another in the vertical direction.

A woven active fiber composite may also include a plurality of electrodes. Generally, any type of electrodes may be used. In some embodiments, printed electrodes can be used. In an exemplary embodiment, conductive wire electrodes may be used.

Generally, any type of conductor may be used for a conductive wire electrode. Examples of conductive materials include, but are not limited to: metallic conductors and non-metallic conductors. Examples of metallic conductors include, but are not limited to: copper, silver, gold, and aluminum as well as other materials. Examples of non-metallic conductors include, but are not limited to: graphite, salt solutions, and plasmas. Typically, a conductive material may be used that can be formed into a wire. In one embodiment, the conductive wire may be an aluminum wire. However, in other embodiments, another type of conductive wire could be used. It should be understood that this list is not meant to be exclusive and other types of conductive materials could also be used as electrodes for an active fiber composite.

Woven active fiber composite 100 can include a plurality of conductive wire electrodes 104. In some embodiments, a conductive wire electrode may comprise a single filament. In other embodiments, a conductive wire electrode may comprise a multi-filament braid. As previously discussed, in one embodiment, conductive wire electrodes 104 may be made of aluminum wire.

Conductive wire electrodes 104 may be oriented in any direction with respect to actuating fibers 102. In some cases, conductive wire electrodes 104 can be disposed in a generally parallel direction with actuating fibers 102. In other cases, conductive wire electrodes 104 can be disposed in a generally perpendicular direction with actuating fibers 102. In still other cases, conductive wire electrodes 104 can be disposed in another direction with respect to actuating fibers 102. In an exemplary embodiment, conductive wire electrodes 104 are disposed in a generally perpendicular direction with actuating fibers 102. In other words, the length of conductive wire electrodes 104 extends in a lateral direction. With this arrangement, a single conductive wire electrode may overlap with a plurality of actuating fibers 102.

Conductive wire electrodes 104 can include first set of conductive wire electrodes 130, also referred to simply as first set of electrodes 130. First set of electrodes 130 can include any number of wire electrodes. For example, first set of electrodes 130 comprises first electrode 131, second electrode 132, third electrode 133, fourth electrode 134, fifth electrode 135, and sixth electrode 136. In some cases, first electrode 131, second electrode 132, third electrode 133, fourth electrode 134, fifth electrode 135, and sixth electrode 136 can be separate wires. In other cases, first electrode 131, second electrode 132, third electrode 133, fourth electrode 134, fifth electrode 135, and sixth electrode 136 can be integrally formed as a single wire electrode.

It will be understood that for purposes of clarity, six electrodes are shown as comprising first set of electrodes 130 in the current embodiment. In other embodiments, however, a set of electrodes could comprise any other number of electrodes.

In a similar manner, conductive wire electrodes 104 can comprise additional sets of electrodes that are spaced apart in the longitudinal direction. For example, in the current embodiment, composite 100 can also comprise second set of electrodes 140 and third set of electrodes 142. Additionally, composite 100 can comprise additional sets of electrodes.

Each set of electrodes may be spaced apart in the longitudinal direction. In some cases, adjacent sets of electrodes may have opposite polarities. For example, first set of electrodes 130 may be associated with a positive polarity, second set of electrodes 140 may be associated with a negative polarity and third set of electrodes 142 may be associated with a positive polarity. This alternating arrangement can continue along the length of composite 100. As voltages are applied to these electrodes with opposite polarities, actuating fibers 102 may extend and/or contract.

In some embodiments, the ends of electrodes may be associated with a conductive member that provides electricity to one or more sets of electrodes. A conductive member could comprise any material that is capable of conducting electricity. In some cases, a conductive member could comprise a similar conductive material to the conductive wire electrodes.

In other cases, however, a conductive member could comprise a different type of conducting material from the conductive wire electrodes. Moreover, in some cases a conductive member could comprise a conductive strip. In other cases, a conductive member could be a conductive wire.

For example, in one embodiment, the ends of electrodes associated with a positive polarity could be attached to a first conductive member while the ends of electrodes associated with a negative polarity could be attached to a second conductive member. The first and second conductive members could then be fastened to opposing sides of composite 100. The first conductive member and the second conductive member may be further associated with other electrical devices, components or systems. With this arrangement, conductive wire electrodes 104 may be in electrical communication with other components, systems or devices via the conductive members. An example of attaching conductive wire electrodes of an active fiber composite to a conductive member is described in Whinnery, U.S. Patent Application Publication No. 2010/0227521, now U.S. patent application Ser. No. 12/397,695, filed on Mar. 3, 2009, the entirety of which is hereby incorporated by reference. This reference may be hereby referred to throughout the remainder of this detailed description as the "active fiber composite case".

Woven active fiber composite 100 may include provisions for associating conductive wire electrodes 104 with actuating fibers 102 in a manner that enhances actuation of actuating fibers 102. In some embodiments, conductive wire electrodes 104 may be laid across a top surface of composite 100. In other embodiments, conductive wire electrodes 104 may be laid across a bottom surface of composite 100. In an exemplary embodiment, conductive wire electrodes 104 may be woven between actuating fibers 102 in a manner that facilitates enhanced actuation by increasing the contact area between actuating fibers 102 and conductive wire electrodes 104.

Generally, conductive wire electrodes 104 can be woven with actuating fibers 102 in any known manner. Examples of different weaving patterns that could be used include any three-dimensional weaves known in the art. It should be understood that while the current embodiment illustrates a particular weaving configuration for conductive wire electrodes 104, other embodiments are not limited to a particular type of weaving configuration. Details of the weaving configuration are discussed in detail below.

A three-dimensional woven active fiber composite may include additional provisions to increase strength. In some embodiments, a woven active fiber composite may include filler fibers to add structural strength to the woven active fiber composite. In some embodiments, filler fibers may be disposed between adjacent pairs of conductive wire electrodes. In some cases, filler fibers may be woven through actuating fibers of a woven active fiber composite. With this arrangement, the filler fibers may strengthen the woven active fiber composite and also assist in maintaining the desired spacing between adjacent pairs of conductive wire electrodes as well as actuating fibers.

As seen in FIGS. 1 through 3, composite 100 may include plurality of filler fibers 150, hereby referred to simply as filler fibers 150. For purposes of clarity, filler fibers 150 are shown in phantom in the current embodiment. Generally, filler fibers associated with a woven active fiber composite may be electrical insulators. For example, in some embodiments, filler fibers may be constructed from fiber glass, including, but not limited to, S-glass and E-glass. In other embodiments, filler fibers may be constructed from another electrically insulating material that can withstand sintering temperatures between 1000 and 1500 degrees Celsius.

In different embodiments, a woven active fiber composite may include varying numbers of filler fibers. In some embodiments, varying numbers of filler fibers may be disposed between adjacent pairs of conductive wire electrodes. In other embodiments, a constant number of filler fibers may be disposed between adjacent pairs of conductive wire electrodes.

In one embodiment, woven active fiber composite 100 may be configured with twelve filler fibers disposed between adjacent sets of electrodes. For example, in the current embodiment, first filler fiber 151, second filler fiber 152, third filler fiber 153, fourth filler fiber 154, fifth filler fiber 155, sixth filler fiber 156, seventh filler fiber 157, eighth filler fiber 158, ninth filler fiber 159, tenth filler fiber 160, eleventh filler fiber 161 and twelfth filler fiber 162 (see FIG. 3) are disposed between first set of electrodes 130 and second set of electrodes 140. In addition, twelve filler fibers are disposed between adjacent sets of electrodes along the length of composite 100.

In some embodiments, filler fibers 150 may be woven through actuating fibers 102. Generally, filler fibers 150 may be woven through actuating fibers 102 in any manner known in the art. Examples of different weaving patterns that could be used include any three-dimensional weaves known in the art. It should be understood that while the current embodiment illustrates a particular weaving configuration for filler fibers 150, other embodiments are not limited to a particular type of weaving configuration. Details of the weaving configuration are discussed in detail below.

Figure 4:
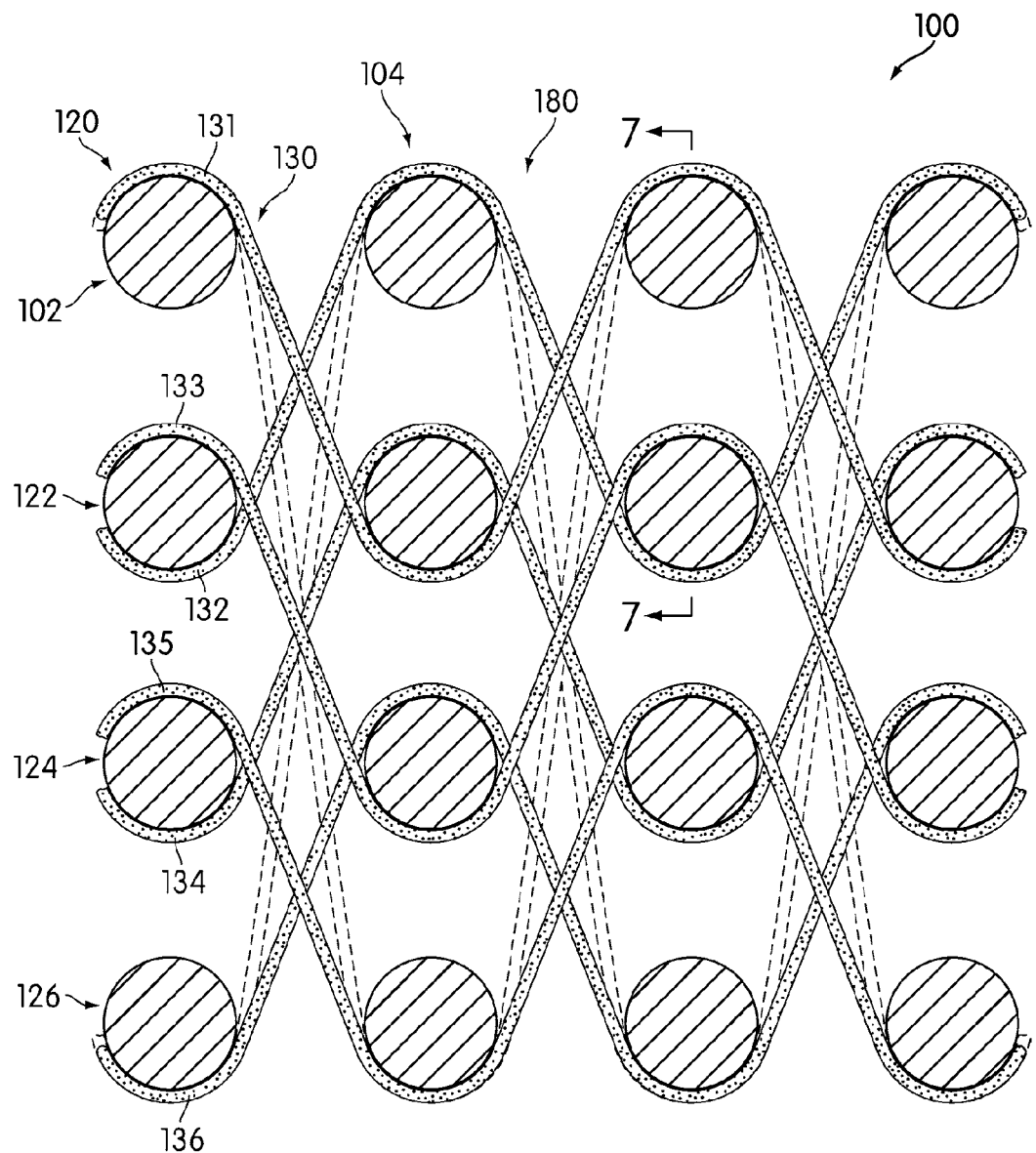
FIG. 4 is a cross-sectional view of an embodiment of a three-dimensional woven active fiber composite indicating the woven pattern of a set of conductive wire electrodes.

FIG. 4 illustrates an embodiment of a weaving configuration for first set of electrodes 130. In some cases, the remaining sets of electrodes may also be configured in a similar weaving pattern. In other embodiments, however, the weaving pattern could vary between different sets of electrodes. Moreover, different weaving patterns could be selected according to desired electrical actuation properties, desired composite geometry, desired composite strength as well as other features or characteristics associated with a three-dimensional woven active fiber composite.

Referring to FIG. 4, each wire electrode of first set of electrodes 130 is woven in an alternating manner between two groups of actuating fibers. As an example, first electrode 131 is woven in an alternating manner between actuating fibers in first group of actuating fibers 120 and actuating fibers in second group of actuating fibers 122. In a similar manner, second electrode 132 is also woven in an alternating manner between actuating fibers in first group of actuating fibers 120 and actuating fibers in second group of actuating fibers 122. In addition, third electrode 133 and fourth electrode 134 are woven in an alternating manner between actuating fibers in second group of actuating fibers 122 and actuating fibers in third group of actuating fibers 124. Fifth electrode 135 and sixth electrode 136 are woven in an alternating manner between actuating fibers in third group of actuating fibers 124 and fourth group of actuating fibers 126.

This woven arrangement provides contact between an electrode and actuating fibers from two adjacent groups of actuating fibers that are separated in the vertical direction. However, it should be understood that this woven arrangement is only intended to be exemplary and in other embodiments other woven arrangements could be used. In various different woven arrangements, one or more electrodes can extend in the vertical and lateral directions in order to wrap around actuating fibers that are spaced apart in both the vertical and lateral directions.

In some embodiments, one or more electrodes can be arranged into an electrode mat. The term "electrode mat" as used throughout this detailed description and in the claims refers to a planar-like arrangement of wire electrodes that extends in both the lateral and vertical directions. In different embodiments, an electrode mat can have different woven topologies that are determined by the electrode weaving pattern in the vertical and lateral directions. In some cases, each electrode mat can behave as a single electrode with either a positive or negative polarity. Moreover, a woven active fiber composite can include multiple electrode mats that are spaced apart from one another in the longitudinal direction which behave as electrodes of alternating polarity.

In the exemplary embodiment, first set of electrodes 130 may be configured as a single electrode mat 180. Electrode mat 180 comprises a woven arrangement of electrodes that are approximately coplanar. In addition, electrode mat 180 extends in the lateral and vertical directions of composite 100. In a similar manner, each set of electrodes along the length of composite 100 may be configured as an electrode mat.

Figure 5:
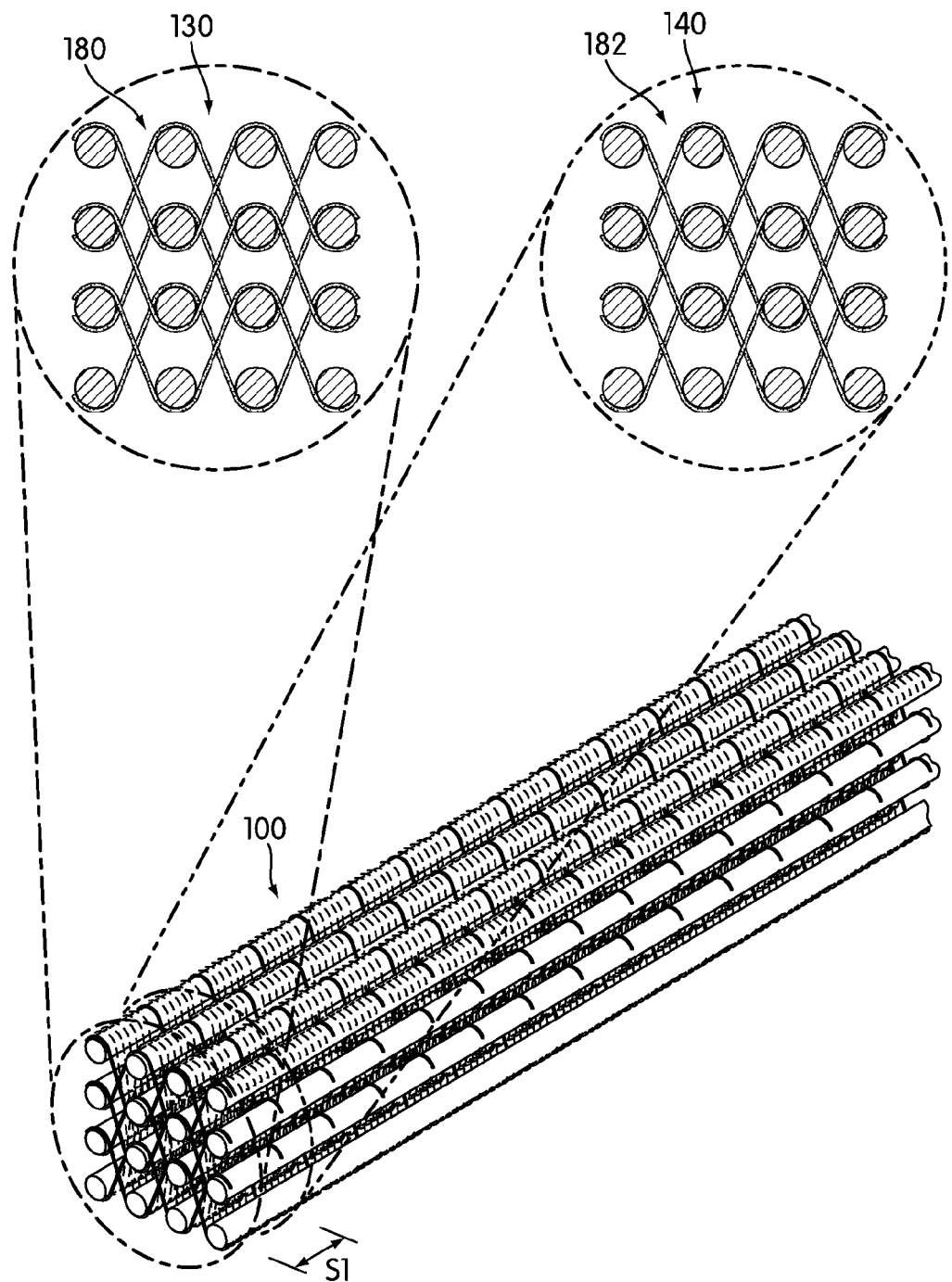
FIG. 5 is an isometric view of an embodiment of a three-dimensional woven active fiber composite indicating the repeated woven pattern of conductive wire electrodes.

FIG. 5 illustrates an isometric view of an embodiment of composite 100. Referring to FIG. 5, first set of electrodes 130 and second set of electrodes 140 comprise substantially similar electrode configurations. In particular, the electrodes of first set of electrodes 130 and second set of electrodes 140 comprise substantially similar weaving patterns in which each electrode is alternately woven between actuating fibers of adjacent groups of actuating fibers, which are spaced apart in the vertical direction. Moreover, first set of electrodes 130 is configured as electrode mat 180 and second set of electrodes 140 is configured as electrode mat 182. In the exemplary embodiment, electrode mat 182 has a substantially similar topology to electrode mat 180. In other words, the weaving pattern of electrodes is substantially similar for electrode mat 180 and electrode mat 182. In a similar manner, the remaining sets of electrodes that are spaced apart along the length of composite 100 may be arranged as substantially similar electrode mats of alternating polarities. In other words, the electrode configuration described above for first set of electrodes 130 may be repeated at each set of electrodes within composite 100. This substantially uniform pattern of electrodes helps improve actuation by improving symmetry along the length of composite 100.

Figure 6:
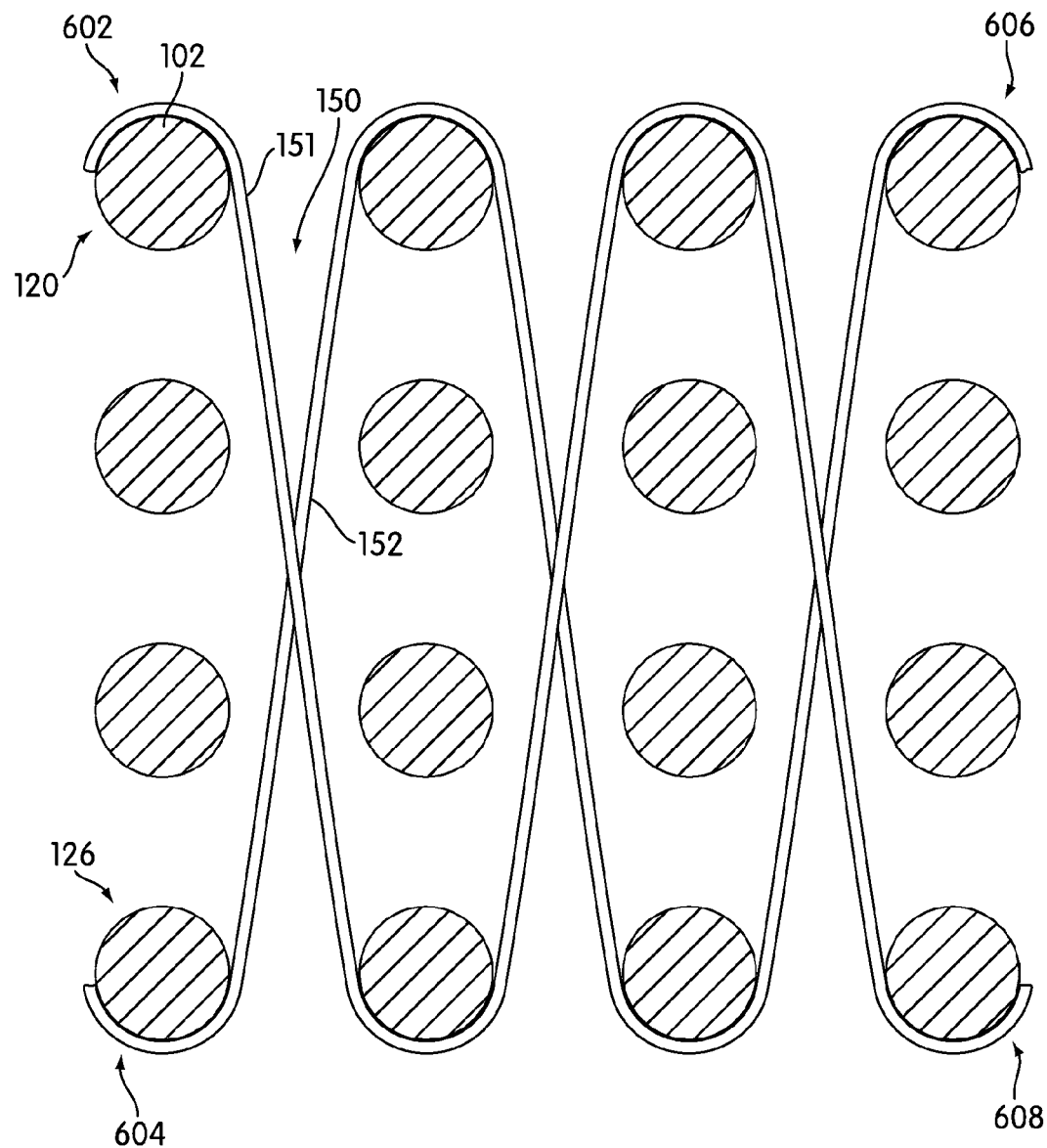
FIG. 6 is a cross-sectional view of an embodiment of a three-dimensional woven active fiber composite indicating the woven pattern of a plurality of filler fibers.

FIG. 6 illustrates an embodiment of a weaving configuration for plurality of filler fibers 150. Although only two filler fibers are visible, in some cases the remaining filler fibers may also be configured in a similar weaving pattern. In other embodiments, however, the weaving pattern could vary between different filler fibers. Moreover, different weaving patterns could be selected according to desired composite geometry, desired composite strength as well as other features or characteristics associated with a three-dimensional woven active fiber composite.

Referring to FIG. 6, first filler fiber 151 is woven through the entire height of composite 100 from first group of actuating fibers 120 to fourth group of actuating fibers 126 in an alternating manner. This is in contrast to the weaving configuration for the electrodes, which are woven between two adjacent groups of actuating fibers. In a similar manner, second filler fiber 152 is woven through composite 100 in an alternating manner between actuating fibers of first group of actuating fibers 120 and fourth group of actuating fibers 126. Moreover, first filler fiber 151 and second filler fiber 152 are woven in reverse directions. In particular, first filler fiber 151 starts at first upper edge 602 of composite 100 and ends at second lower edge 608 of composite 100 while second filler fiber 152 starts at first lower edge 604 of composite 100 and ends at second upper edge 606 of composite 100.

This woven arrangement provides contact between a filler fiber and actuating fibers from two different groups of filler fibers that are separated in the vertical direction. However, it should be understood that this woven arrangement is only intended to be exemplary and in other embodiments other woven arrangements could be used. In other embodiments, for example, filler fibers may be not woven through the entire height of a composite. In various different woven arrangements, one or more filler fibers can extend in the vertical and lateral directions in order to wrap around actuating fibers that are spaced apart in both the vertical and lateral directions.

In some cases, the weaving of filler fibers 150 can increase the structural strength of woven active fiber composite 100. In particular, filler fibers 150 can reduce the potential of buckling between conductive wire electrodes 104 of actuating fibers 102. With this configuration, filler fibers 150 can help maintain the alignment of actuating fibers 102 in the axial direction. In addition, in some cases, the weaving of filler fibers 150 may also assist in maintaining the lateral spacing between adjacent actuating fibers 102.

Figure 7:
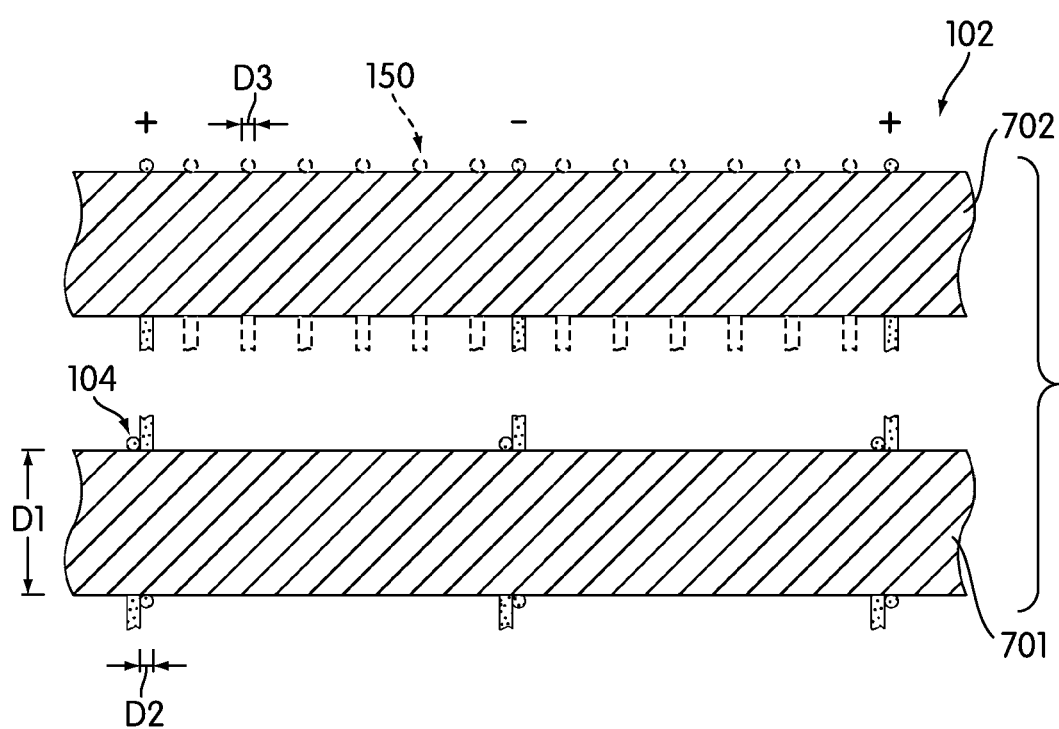
FIG. 7 is a cross-sectional view of an embodiment of a several actuating fibers.

FIG. 7 illustrates a cross-sectional view of an embodiment of a portion of a woven active fiber composite. In particular, FIG. 7 illustrates a cross-sectional view of actuating fiber 701 and actuating fiber 702 of composite 100 for purposes of describing the sizes and shapes of actuating fibers 102, conductive wire electrodes 104, and filler fibers 150.

In some embodiments, the sizes and/or shapes of actuating fibers and conductive wire electrodes may vary. In some cases, varying the sizes and/or shapes of actuating fibers and conductive wire electrodes may modify the feature size of an electrode pattern. Using smaller electrode feature sizes may provide for increased robustness for a woven active fiber composite, especially over traditional active fiber composite designs that have a minimum electrode feature size. In other cases, modifying the sizes and/or shapes of actuating fibers and conductive wire electrodes may allow for different structural properties for the woven active fiber composite.

Actuating fibers 102 can have any size. In particular, the length and diameter of actuating fibers 102 can vary. In the current embodiment, only a portion of the length of actuating fibers 102 is illustrated. However, it should be understood that actuating fibers 102 could have any length necessary for constructing a woven active fiber composite of a particular length.

Generally, actuating fibers 102 may have any cross-sectional shape. Examples of different cross-sectional shapes include, but are not limited to: squares, rectangles, circles, triangles, regular shapes, irregular shapes as well as any other shapes. In this exemplary embodiment, actuating fibers 102 may be associated with a generally circular cross-sectional shape (see FIG. 6).

Referring to FIG. 7, in this embodiment, actuating fibers 102 may be associated with diameter D1. Generally, diameter D1 can have any value. In some embodiments, diameter D1 may have a value in the range of 10 micrometers to 200 micrometers. In other embodiments, diameter D1 may have a value in the range of 50 micrometers to 150 micrometers.

In different embodiments, the shape of conductive wire electrodes 104 can also vary. In some embodiments, conductive wire electrodes 104 can have any cross-sectional shape that has been previously discussed for actuating fibers 102. In an exemplary embodiment, conductive wire electrodes 104 may have a generally circular cross-sectional shape.

In different embodiments, the size of conductive wire electrodes 104 can also vary. In particular, the length and diameter of conductive wire electrodes 104 can vary. In one embodiment, conductive wire electrodes 104 may be associated with diameter D2. Generally, diameter D2 can have any value. In some embodiments, diameter D2 may have a value in the range of 1 micrometer to 200 micrometers. In other embodiments, diameter D2 may have a value in the range of 5 micrometers to 25 micrometers.

In some embodiments, the spacing between adjacent sets of conductive wire electrodes can vary. In some cases, the spacing between adjacent sets of conductive wire electrodes may be irregular. In other cases, the spacing between adjacent sets of conductive wire electrodes may be regular. In an exemplary embodiment, adjacent sets of conductive wire electrodes may be evenly spaced. This arrangement may help to create substantially uniform electromagnetic fields for interacting with actuating fibers. Additionally, this arrangement may help create an even weave pattern that facilitates substantially uniform composite strength over the entirety of a woven active fiber composite.

Referring back to FIG. 5, adjacent sets of conductive wire electrodes 104 may be spaced apart by spacing S1. In some embodiments, the value of spacing S1 may be in the range between 5 and 500 micrometers. In other embodiments, the value of spacing S1 may be in the range between 100 and 200 micrometers.

In different embodiments, the shape of filler fibers 150 can vary. In some embodiments, filler fibers 150 can have any cross-sectional shape that has been previously discussed for actuating fibers 102. In some embodiments, filler fibers 150 and conductive wire electrodes 104 may have different cross-sectional shapes. In other embodiments, filler fibers 150 and conductive wire electrodes 104 may have substantially similar cross-sectional shapes. Referring to FIG. 7, in the exemplary embodiment, filler fibers 150 and conductive wire electrodes 104 are configured with generally circular cross-sectional shapes.

In an exemplary embodiment, filler fibers 150 may be associated with diameter D3. In some cases, diameter D3 may be smaller than diameter D2 that is associated with conductive wire electrodes 104. In other cases, diameter D3 may be larger than diameter D2. In one embodiment, diameter D2 of conductive wire electrodes 104 may be substantially similar to diameter D3 of filler fibers 150. With substantially similar diameters and cross-sectional shapes, conductive wire electrodes 104 and filler fibers 150 may present a generally flat outer surface for woven active fiber composite 100.

Generally, the size of a contact region between an actuating fiber and a woven conductive wire electrode can be varied by changing the diameters of the actuating fibers and/or the conductive wire electrodes as well as other features of the geometry. In some cases, the size of the contact region can be decreased. In other cases, the size of the contact region can be increased. In an exemplary embodiment, the size of the contact region can be increased to allow for near-continuous contact between the conductive wire electrode and the actuating fiber by virtue of the woven topology.

In some embodiments, a woven active fiber composite may include actuating fibers with periodically varying diameters. By varying the diameters of the actuating fibers periodically, conductive wire electrodes and filler fibers may be applied at period minimums of the actuating fibers diameters. In some cases, this may help present a generally flat outer surface for a woven active fiber composite. Examples of actuating fibers with periodically varying diameters are described in the active fiber composite case.

By weaving conductive wire electrodes 104 with actuating fibers 102 and filler fibers 150, various desirable features for an active fiber composite can be achieved in an efficient manner. For example, the woven configuration described in the embodiments helps to provide a highly uniform spacing between adjacent electrode sets. In addition, the electrode sets may be configured as electrode mats that are highly planar in order to achieve a high degree of symmetry along the active fiber composite. Moreover, using the woven arrangement helps to achieve a high level of parallelism between adjacent electrode mats. Each of these features can facilitate increased actuation efficiency for an active fiber composite.

In the embodiments discussed above and shown in the Figures, active fiber composite 100 is approximately straight. In some cases, actuating fibers 102 can be maintained in a substantially straight configuration by tuning the weaving configuration. In other cases, however, actuating fibers 102 could be arranged in a curved configuration by tuning the weaving configuration. In other words, the woven nature of composite 100 allows for the creation of both straight and curved geometries for a three-dimensional woven active fiber composite. The geometry can be varied by adjusting the weaving pattern accordingly.

Figure 8:
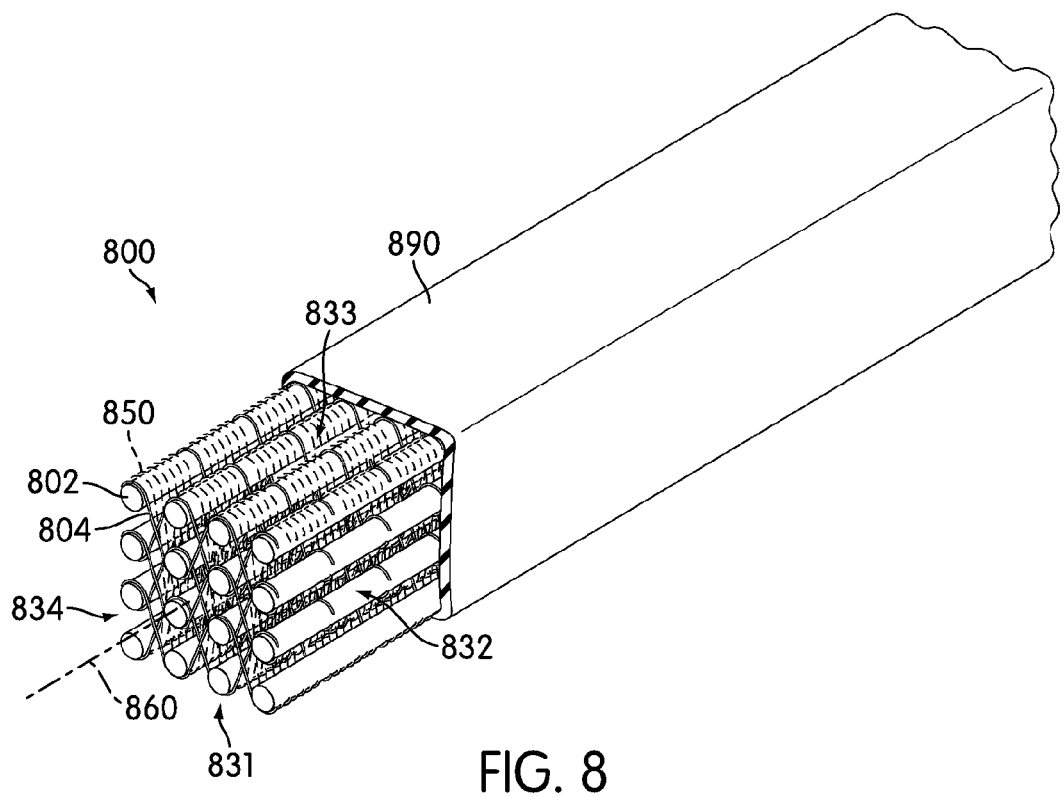
FIG. 8 is an isometric view of an embodiment of a three-dimensional woven active fiber composite including a sleeve member.
Figure 9:
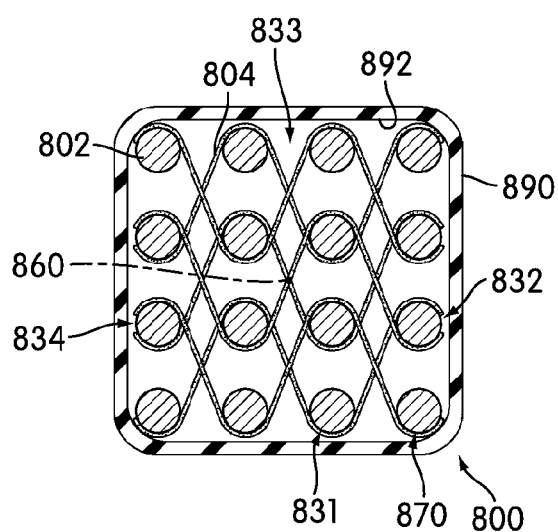
FIG. 9 is a cross-sectional view of an embodiment of a three-dimensional woven active fiber composite including a sleeve member.

FIG. 8 illustrates an isometric view of another embodiment of composite 800. FIG. 9 illustrates a cross-sectional view of an embodiment of composite 800. Referring to FIGS. 8 and 9, composite 800 includes actuating fibers 802 as well as conductive wire electrodes 804. In particular, conductive wire electrodes 804 may be woven between actuating fibers 802 in a substantially similar manner to the embodiment discussed above. Additionally, composite 800 can include filler fibers 850 that are woven between actuating fibers 802 and help to reinforce composite 800.

A three-dimensional woven active fiber composite can include provisions to help prevent actuating fibers from separating. In some cases, a sleeve member can be used to provide containment of the actuating fibers in the lateral and vertical directions. In some cases, a sleeve member can provide compressive containment of the actuating fibers in the lateral and vertical directions. In one embodiment, a sleeve member may be wrapped around an outer periphery of a composite.

Composite 800 can further be associated with sleeve member 890. Sleeve member 890 may be configured to wrap around the outermost edges of composite 800. In particular, inner surface 892 is configured to contact lower edge 831, first lateral edge 832, upper edge 833, and second lateral edge 834 of composite 800. Lower edge 831, first lateral edge 832, upper edge 833, and second lateral edge 834 may comprise outer periphery 870 of composite 800. This arrangement helps to confine composite 800 in the lateral and vertical directions.

Generally, the length of sleeve member 890 can vary in different embodiments. In some cases, sleeve member 890 may extend along the entire length of composite 800. In other cases, sleeve member 890 may cover only some portions of composite 800 in the longitudinal direction.

Sleeve member 890 can have any material properties. In some cases, sleeve member 890 may be substantially flexible. In some cases, sleeve member 890 may be substantially elastic. In other cases, sleeve member 890 could be rigid to provide rigid support to composite 800 in the vertical and lateral directions.

For purposes of description, the term "radial direction" is used throughout this detailed description and in the claims to refer to any direction that is perpendicular to the longitudinal or axial direction. For example, the radial direction in the current embodiment is any direction perpendicular to an axial line extending through the center of a composite. Moreover, the term "radial outward direction" is associated with any direction directed radially from an axial centerline towards an outer portion of a composite. Likewise, the term "radial inward direction" is associated with any direction directed radially from an outer portion of a composite towards an axial centerline.

Referring to FIGS. 8 and 9, sleeve member 890 may provide compressive containment in the radial direction. In particular, sleeve member 890 applies a compressive force that is directed radially inward from sleeve member 890 towards axial center line 860. This compressive force acts to prevent any separation of composite 800 in the radially outward direction. It will be understood that as the compressive force acts radially inward, the compressive force will also prevent any separation of composite 800 in the lateral and vertical directions. Using this configuration, sleeve member 890 helps to retain the cross-sectional shape of composite 800 while still allowing stroke and actuation of actuating fibers 802 in the axial direction. This arrangement may help reduce or eliminate the need to fill composite 800 with a resin.

Although the current embodiment illustrates a sleeve member that is substantially continuous, the properties of a sleeve member could vary in other embodiments. For example, in another embodiment, a sleeve member can be a mesh sleeve. In other embodiments, one or more holes, slots, or other features could be provided in the surface of a sleeve member. Furthermore, while the current embodiment illustrates a sleeve member with an approximately rectangular cross-sectional shape, in other embodiments a sleeve member could have any other cross-sectional shape that conforms to the cross-sectional shape of an associated composite.

Three-dimensional woven active fiber composites can be manufactured with any three-dimensional cross-sectional shape. In particular, while the previous embodiments illustrate composites with approximately rectangular cross-sectional shapes, in other embodiments active fiber composites can be manufactured with any other cross-sectional shapes including, but not limited to: rectangular, square, triangular, rounded, oval, circular, star, pentagon, hexagon, as well as any polygonal shapes or any other kind of cross-sectional shapes. Moreover, the cross-sectional shape could be regular or irregular. In addition, in embodiments including a sleeve member, the sleeve member could have a substantially similar cross-sectional shape to match the cross-sectional shape of the composite.

Figure 10:
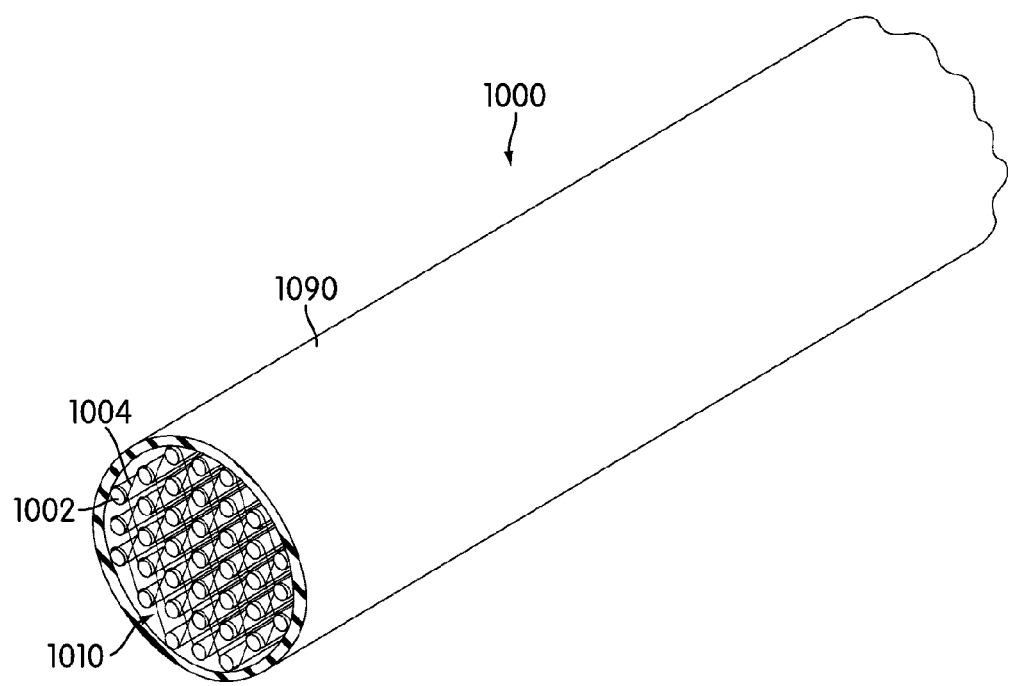
FIG. 10 is an isometric view of an embodiment of a rounded cross-sectional shape for a three-dimensional woven active fiber composite.
Figure 11:
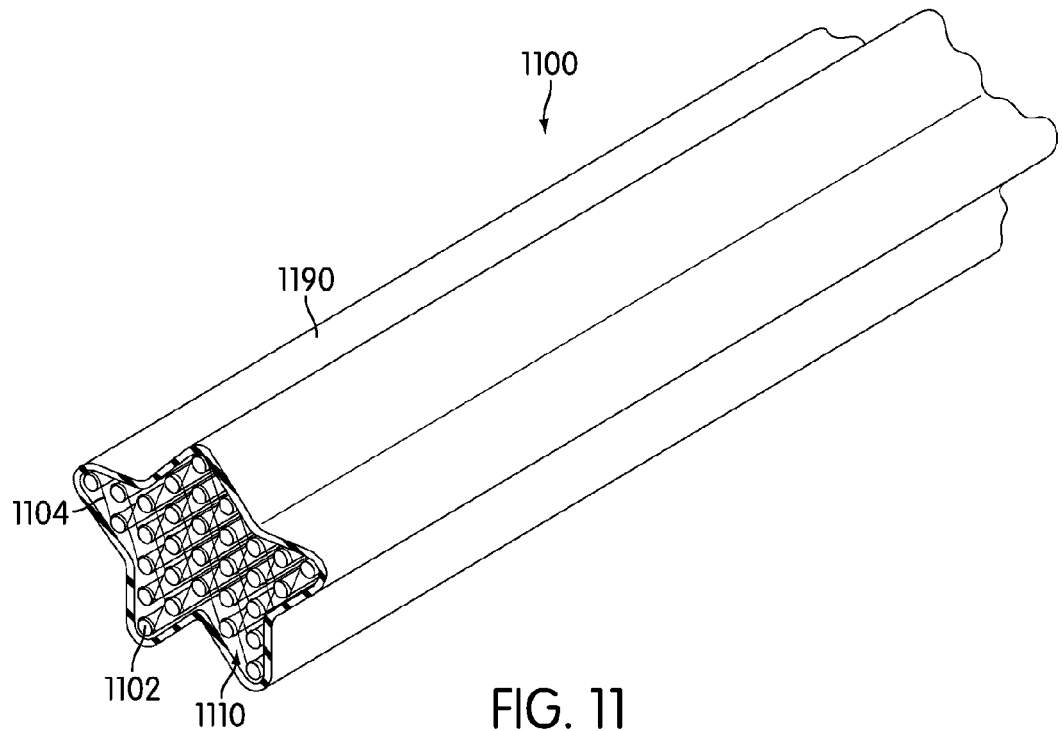
FIG. 11 is an isometric view of an embodiment of a star-like cross-sectional shape for a three-dimensional woven active fiber composite.
Figure 12:
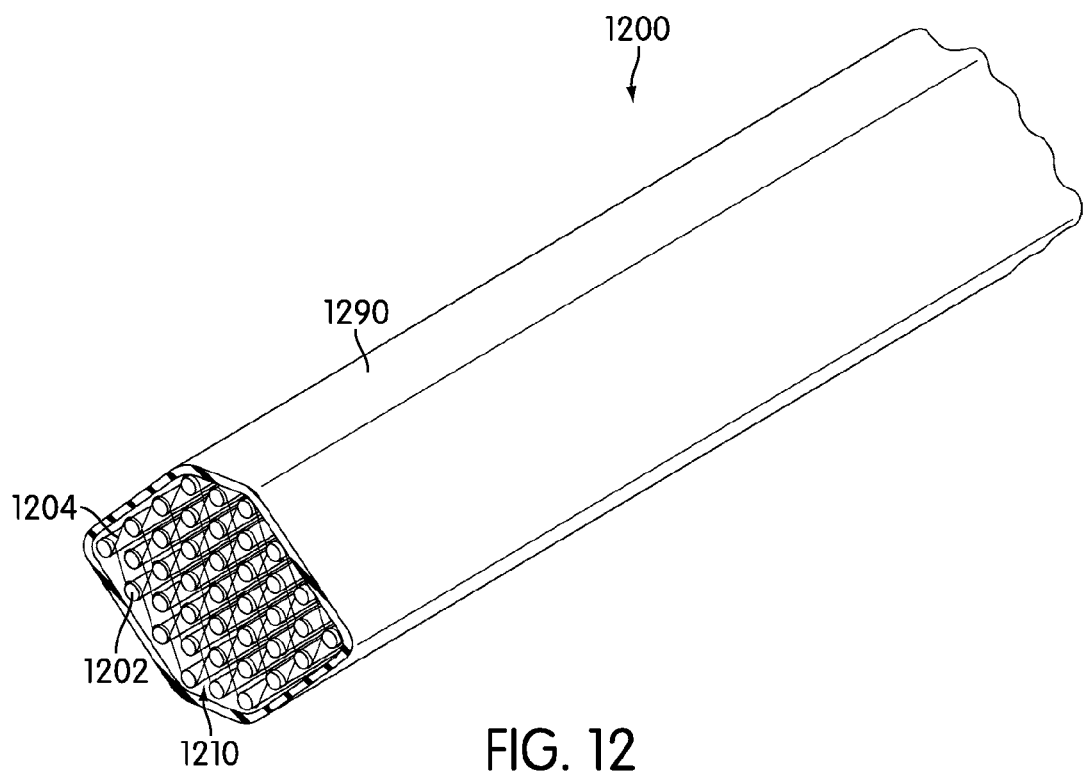
FIG. 12 is an isometric view of an embodiment of a hexagonal cross-sectional shape for a three-dimensional woven active fiber composite.

FIGS. 10 through 12 illustrate exemplary embodiments of different cross-sectional shapes for a three-dimensional woven active fiber composite. Referring to FIG. 10, composite 1000 has an approximately circular cross-sectional shape. In particular, actuating fibers 1002 are woven together using electrodes 1004 and filler fibers in a manner to provide an approximately circular outer edge 1010. In addition, sleeve member 1090 also has an approximately circular cross-sectional shape. Referring to FIG. 11, composite 1100 has an approximately star-like cross-sectional shape. In particular, actuating fibers 1102 are woven together using electrodes 1104 and filler fibers in a manner to provide an approximately star shaped outer edge 1110. In addition, sleeve member 1190 also has an approximately star-like cross-sectional shape. Referring to FIG. 12, composite 1200 has an approximately hexagonal cross-sectional shape. In particular, actuating fibers 1202 are woven together using electrodes 1204 and filler fibers in a manner to provides an approximately hexagon shaped outer edge 1210. In addition, sleeve member 1290 also has an approximately hexagonal cross-sectional shape. By manufacturing a three-dimensional woven active fiber composite to have various different cross-sectional shapes, the composite may be used in a variety of different situations that require actuators of different geometries.

Figure 13:
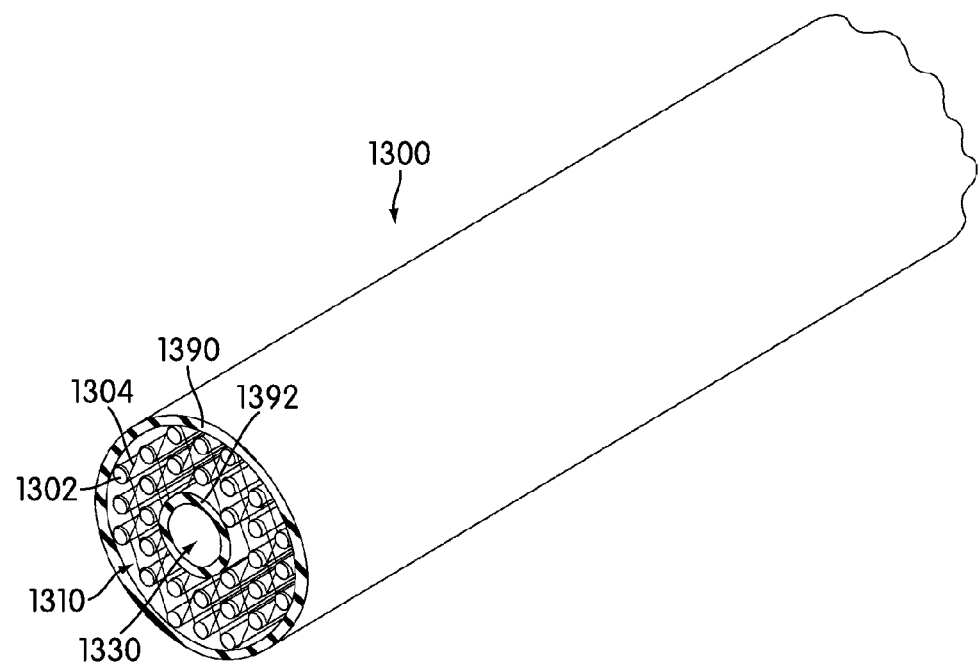
FIG. 13 is an isometric view of an embodiment of an annular cross-sectional shape for a three-dimensional woven active fiber composite.
Figure 14:
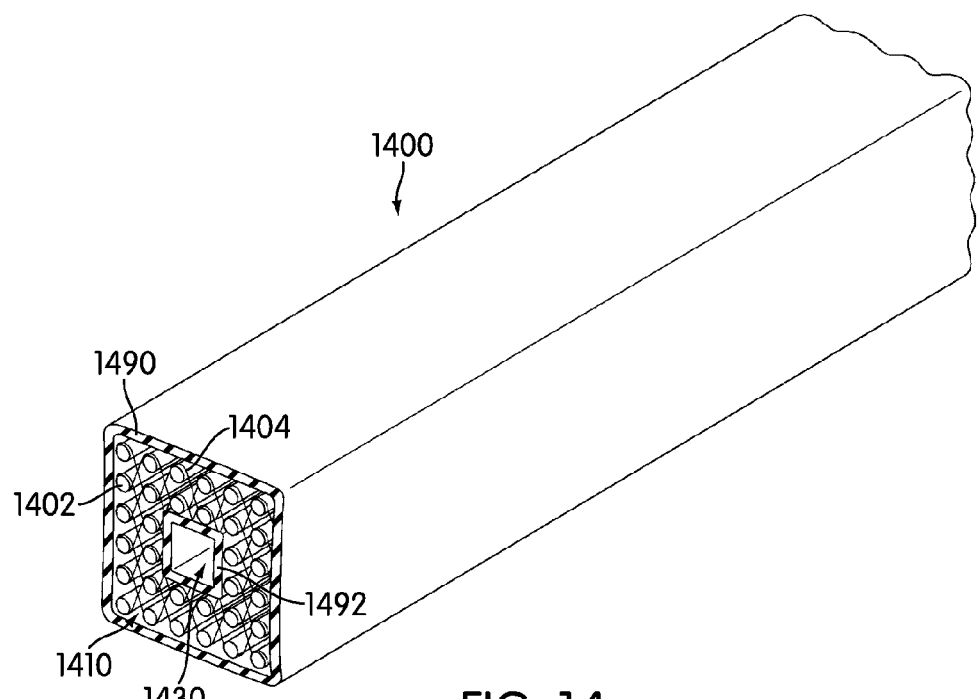
FIG. 14 is an isometric view of an embodiment of a rectangular cross-sectional shape with a hollow core for a three-dimensional woven active fiber composite.

In some embodiments, a composite could have a geometry with one or more hollow sections. For example, referring to FIG. 13, composite 1300 has an approximately annular cross-sectional shape. In particular, actuating fibers 1302 are woven together using electrodes 1304 and filler fibers in a manner to provide an approximately circular outer edge 1310. In addition, outer sleeve member 1390 also has an approximately circular cross-sectional shape. Also, composite 1300 has a hollowed out central portion 1330, which has an approximately circular cross-sectional shape. In some cases, hollowed out central portion 1330 provides a hollow region where no actuating fibers, filler fibers or electrodes are present. Moreover, in some cases, central portion 1330 can be reinforced using an inner sleeve member 1392. Referring to FIG. 14, composite 1400 has an approximately rectangular cross-sectional shape. In particular, actuating fibers 1402 are woven together using electrodes 1404 and filler fibers in a manner to provide an approximately rectangular outer edge 1410. In addition, outer sleeve member 1490 also has an approximately rectangular cross-sectional shape. Also, composite 1400 has a hollowed out central portion 1430, which has an approximately rectangular cross-sectional shape. In some cases, hollowed out central portion 1430 provides a hollow region where no actuating fibers, filler fibers or electrodes are present. Moreover, in some cases, central portion 1430 can be reinforced using an inner sleeve member 1492. By using a hollowed cross sectional shape, the weight of a composite can be reduced. Moreover, using hollowed out shapes may provide for increased adaptability of a composite to different components with varying geometries.

In still other embodiments, any cross sectional shapes could be used and may include hollowed out central portions of a variety of different cross sectional shapes. In some cases, the hollow central portion could have a different cross-sectional shape than the cross-sectional shape of the whole composite. For example, one embodiment can include a composite with a rectangular cross-sectional shape and a hollow central portion with a circular cross sectional shape.

Although the current embodiments illustrate various cross-sectional shapes for a composite that are constant along the length of a composite, in other embodiments it will be understood that a composite could have varying cross-sectional shapes along the length of the composite. For example, the cross-sectional shape could vary between rounded and rectangular cross-sectional shapes. The woven nature of the active fiber composites allows for a wide variety of different composite geometries that can be easily created to meet the specific geometric requirements of a given system where an actuating composite is used.

A three-dimensional woven active fiber composite can be manufactured using any known processes for manufacturing three-dimensional woven composites as well as processes known for manufacturing active fiber composites. An exemplary method for manufacturing a two dimensional woven active fiber composite is described in the active fiber composite case. In some cases, for manufacturing a three-dimensional woven active fiber composite, the manufacturing steps could be substantially similar to the method used for the two dimensional case, with the step of weaving actuating fibers with electrodes and/or filler fibers modified to incorporate three-dimensional weaving configurations for the electrodes and/or filler fibers. However, in other cases, any methods known in the art can be used.

Additionally, a composite could be manufactured to have any length. In some cases, the composite may be manufactured with a predetermined length, while in other cases the composite could be manufactured as a bulk composite that may be cut to a desired size depending on the application of the composite material. In some cases, a composite portion could be cut from a bulk composite before sintering. In other cases where sintered PZT fibers are used, a composite portion could be cut from a bulk composite after sintering.

While various embodiments of the invention have been described, the description is intended to be exemplary, rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

What is claimed is:

1. A woven active fiber composite, comprising:
a longitudinal direction extending along a length of the woven active fiber composite;
a lateral direction extending along a width of the woven active fiber composite;
a vertical direction extending along a height of the woven active fiber composite;
a plurality of actuating fibers, each actuating fiber extending in the longitudinal direction;
a first group of actuating fibers from the plurality of actuating fibers that are spaced apart from one another in the lateral direction;
a second group of actuating fibers from the plurality of actuating fibers that are spaced apart from one another in the lateral direction;
the second group of actuating fibers being spaced apart from the first group of actuating fibers in the vertical direction;
a conductive wire electrode configured to transfer electrical energy to and from the first group of actuating fibers and the second group of actuating fibers; and
wherein the conductive wire electrode is in contact with at least one actuating fiber from the first group of actuating fibers and wherein the conductive wire electrode is in contact with at least one actuating fiber from the second group of actuating fibers.

2. The woven active fiber composite according to claim 1, wherein the conductive wire electrode is woven in an alternating manner between the first group of actuating fibers and the second group of actuating fibers.

3. The woven active fiber composite according to claim 1, wherein a plurality of electrodes are woven between the first group of actuating fibers and the second group of actuating fibers.

4. The woven active fiber composite according to claim 1, wherein a first set of conductive wire electrodes are woven between the first group of actuating fibers and the second group of actuating fibers at a first longitudinal position of the woven active fiber composite and wherein a second set of conductive wire electrodes are woven between the first group of actuating fibers and the second group of actuating fibers at a second longitudinal position that is different from the first longitudinal position.

5. The woven active fiber composite according to claim 4, wherein the first set of conducive wire electrodes and the second set of conductive wire electrodes have opposite polarities.

6. The woven active fiber composite according to claim 1, wherein the plurality of actuating fibers includes a third group of actuating fibers that is spaced apart from the first group of actuating fibers and the second group of actuating fibers in the vertical direction and wherein at least one conductive wire electrode is woven between the second group of actuating fibers and the third group of actuating fibers.

7. A woven active fiber composite, comprising:
a longitudinal direction extending along a length of the woven active fiber composite;
a lateral direction extending along a width of the woven active fiber composite;
a vertical direction extending along a height of the woven active fiber composite;
a plurality of actuating fibers extending in the longitudinal direction;
the plurality of actuating fibers being spaced apart in the lateral direction and the vertical direction;
a plurality of conductive wire electrodes configured to transfer electrical energy to and from the plurality of actuating fibers; and
wherein a first set of conductive wire electrodes are woven in a planar configuration between the plurality of actuating fibers, the planar configuration of conductive wire electrodes extending in the lateral direction and the vertical direction.

8. The woven active fiber composite according to claim 7, wherein a second set of conductive wire electrodes are woven in a planar configuration between the plurality of actuating fibers, the planar configuration of conductive wire electrodes extending in the lateral direction and the vertical direction and wherein the first set of conductive wire electrodes is spaced apart from the second set of conductive wire electrodes in the longitudinal direction.

9. The woven active fiber composite according to claim 8, wherein the first set of conductive wire electrodes and the second set of conductive wire electrodes have opposite polarities.

10. The woven active fiber composite according to claim 8, wherein the woven patterns of the first set of conductive wire electrodes and the second set of conductive wire electrodes are substantially similar.

11. The woven active fiber composite according to claim 8, wherein the woven patterns of the first set of conductive wire electrodes and the second set of conductive wire electrodes are substantially different.

12. The woven active fiber composite according to claim 7, wherein the woven active fiber composite has an approximately rectangular cross-sectional shape.

13. The woven active fiber composite according to claim 7, wherein the woven active fiber composite has an approximately rounded cross-sectional shape.

14. The woven active fiber composite according to claim 7, wherein the woven active fiber composite has an approximately star-like cross-sectional shape.

15. The woven active fiber composite according to claim 7, wherein the woven active fiber composite has an approximately polygonal cross-sectional shape.

16. The woven active fiber composite according to claim 7, wherein the cross sectional shape of the active fiber composite varies in the longitudinal direction.

17. The woven active fiber composite according to claim 7, wherein the cross sectional shape of the active fiber composite varies in a direction that is perpendicular to the longitudinal direction.

18. The woven active fiber composite according to claim 7, wherein the active fiber composite includes a hollowed out central portion.

19. The woven active fiber composite according to claim 18, wherein the active fiber composite has an annular cross sectional shape.

20. The woven active fiber composite according to claim 18, wherein the active fiber composite has a rectangular cross sectional shape and wherein the hollowed out central portion has a rectangular cross sectional shape.

21. A woven active fiber composite, comprising:
- a longitudinal direction extending along a length of the woven active fiber composite;
- a radial direction that is perpendicular to the longitudinal direction, the radial direction extending from an axial center line of the woven active fiber composite;
- a plurality of actuating fibers, each actuating fiber extending in the longitudinal direction;
- the plurality of actuating fibers being spaced apart in a lateral direction and a vertical direction;
- a plurality of conductive wire electrodes configured to transfer electrical energy to and from the plurality of actuating fibers, the plurality of conductive wire electrodes being interwoven with the plurality of actuating fibers;
- a sleeve member extending in the longitudinal direction; and
- wherein the sleeve member is configured to wrap around an outer periphery of the woven active fiber composite and thereby provide containment of the woven active fiber composite in the radial direction.

22. The woven active fiber composite according to claim 21, wherein the sleeve member is substantially flexible.

23. The woven active fiber composite according to claim 21, wherein the sleeve member provides a compressive force that is directed radially inward from the outer periphery to the axial center line.

24. The woven active fiber composite according to claim 21, wherein the sleeve member extends along a majority of the length of the woven active fiber composite.

25. The woven active fiber composite according to claim 21, wherein the sleeve member helps maintain an approximately constant width and height for the woven active fiber composite.

26. A woven active fiber composite, comprising:
- a longitudinal direction extending along a length of the woven active fiber composite;
- a lateral direction extending along a width of the woven active fiber composite;
- a vertical direction extending along a height of the woven active fiber composite;
- a plurality of actuating fibers, each actuating fiber extending in the longitudinal direction;
- the plurality of actuating fibers being spaced apart from one another in the lateral direction and the vertical direction;
- a first set of conductive wire electrodes woven between the plurality of actuating fibers and a second set of conductive wire electrodes woven between the plurality of actuating fibers, wherein the first set of conductive wire electrodes is spaced apart from the second set of conductive wire electrodes in the longitudinal direction;
- a plurality of filler fibers woven between the actuating fibers; and
- wherein the plurality of filler fibers are disposed between the first set of conductive wire electrodes and the second set of conductive wire electrodes.

27. The woven active fiber composite of claim 26, wherein the plurality of filler fibers comprise S-glass.

28. The woven active fiber composite of claim 26, wherein the plurality of filler fibers comprise E-glass.

29. The woven active fiber composite of claim 26, wherein the plurality of filler fibers provide structural support for the woven active fiber composite.

30. The woven active fiber composite of claim 26, wherein the plurality of filler fibers are woven throughout the vertical height of the woven active fiber composite.

* * * * *